United States Patent
Ko

(10) Patent No.: US 9,666,505 B1
(45) Date of Patent: May 30, 2017

(54) POWER MOS TRANSISTOR DIE WITH TEMPERATURE SENSING FUNCTION AND INTEGRATED CIRCUIT

(71) Applicant: uPI Semiconductor Corp., Hsinchu County (TW)

(72) Inventor: Sheng-An Ko, Hsinchu County (TW)

(73) Assignee: uPI Semiconductor Corp., Hsinchu County (TW)

( * ) Notice: Subject to any disclaimer, the term of this patent is extended or adjusted under 35 U.S.C. 154(b) by 0 days.

(21) Appl. No.: 15/093,753

(22) Filed: Apr. 8, 2016

(30) Foreign Application Priority Data

Dec. 10, 2015 (TW) .............................. 104141473 A

(51) Int. Cl.
*H01L 23/34* (2006.01)
*H01L 27/088* (2006.01)

(52) U.S. Cl.
CPC ............ *H01L 23/34* (2013.01); *H01L 27/088* (2013.01)

(58) Field of Classification Search
CPC ...................................................... H01L 23/34
See application file for complete search history.

(56) References Cited

U.S. PATENT DOCUMENTS

| 4,903,106 | A | * | 2/1990 | Fukunaga | H01L 27/0211 257/378 |
| 5,049,961 | A | * | 9/1991 | Zommer | H01L 27/0248 257/252 |
| 5,237,194 | A | * | 8/1993 | Takahashi | H01L 27/088 257/337 |
| 5,389,813 | A | | 2/1995 | Schwob | |
| 5,726,481 | A | * | 3/1998 | Moody | H01L 27/0248 257/467 |
| 6,671,152 | B1 | | 12/2003 | Hersel et al. | |
| 7,368,784 | B2 | * | 5/2008 | Botti | H03K 17/0822 257/341 |

\* cited by examiner

*Primary Examiner* — Patrick O'Neill
(74) *Attorney, Agent, or Firm* — Jianq Chyun IP Office

(57) ABSTRACT

A power metal oxide semiconductor (MOS) transistor die with a temperature sensing function and an integrated circuit are provided. The power MOS transistor die has a control terminal, a phase terminal, a ground terminal and a temperature signal output terminal, and that further includes a power switch part and a temperature sensing part. The power switch part has: a first electrode coupled to the control terminal; a second electrode coupled to the ground terminal; and a third electrode coupled to the phase terminal. The temperature sensing part has: a first electrode; a second electrode coupled to the temperature signal output terminal; and a third electrode coupled to the third electrode of the power switch part. The power switch part and the temperature sensing part are configured as a MOS transistor made by a same manufacturing process, and are capable of sensing temperature precisely.

9 Claims, 11 Drawing Sheets

POWER MOS TRANSISTOR DIE WITH TEMPERATURE SENSING FUNCTION AND INTEGRATED CIRCUIT

CROSS-REFERENCE TO RELATED APPLICATION

This application claims the priority benefit of Taiwan application serial no. 104141473, filed on Dec. 10, 2015. The entirety of the above-mentioned patent application is hereby incorporated by reference herein and made a part of this specification.

BACKGROUND OF THE INVENTION

1. Field of the Invention

The present invention generally relates to an integrated circuit, in particular, to a power metal-oxide-semiconductor (MOS) transistor die with temperature sensing function and an integrated circuit.

2. Description of Related Art

FIG. 1 is a drawing schematically illustrating a circuit of a conventional temperature sensor. Referring to FIG. 1, a temperature sensor uses a bipolar junction transistor (BJT) 12, such as NPN or PNP, and a current source 14. The PN junction would generate different voltage in accordance with different temperature. A comparator 16 compares the generated voltage with a voltage, which is not related to temperature. For example, the voltage bias at the PN junction is 0.4V when at 160° C., then the voltage 0.4 V is set as the preset value. Then, a temperature protection signal OTP is outputted when the voltage is greater than 0.4V for a purpose of protecting the integrated circuit (IC) from overheating which can stop the operation which may cause high temperature.

FIG. 2 is drawing schematically illustrating a top view of conventional IC deployment. The IC is constituted of dies in various functions and each die is formed from multiple cells. Referring to FIG. 2, an IC 200 includes power MOS transistor dies 20, 22 and controller die 24. In general, the temperature sensor is configured in the controller die 24. However, when the IC 200 includes the power MOS transistor dies 20, 22 and the controller die 24, the power MOS transistor dies 20, 22 would be a region with highest temperature of the whole IC because a large current would flow through the power MOS transistor dies 20, 22. However, the temperature sensed by the conventional sensing technology is not at the highest temperature. Thus, if the temperature sensor is configured in the controller die 24, it cannot have high temperature protection at all for the IC 200 and the IC 200 may be easily burnt down due to over heating.

FIG. 3A is a drawing, schematically illustrating an equivalent circuit for the conventional power MOS transistor die. FIG. 3B is a drawing, schematically illustrating the cross-sectional view of structure of the power MOS transistor die in FIG. 3A. The power MOS transistor die 30 shown in FIG. 3B has three NMOS cells with same structure. The indications of "PHASE", "LG", and "GND" respectively represent a phase terminal, a control terminal, and a ground terminal. The indications of "G", "D", and "S" respectively represent a gate, a drain and a source. The indications of "n+", "n-", "p+", "pw", and "SiO$_2$" respectively represent a highly doped n-type region, a lowly doped n-type region, a highly doped p-type region, p well region, and silicon oxide region. The detail structure of power MOS transistor die is known to the one with ordinary skill in the art, and the detail structure is omitted in the following descriptions.

SUMMARY OF THE INVENTION

The invention provides an integrated circuit with a temperature sensing function. The integrated circuit comprises a power MOS transistor die. The power MOS transistor die comprises a control terminal, a phase terminal, a ground terminal, and a temperature signal output terminal. The power MOS transistor die further comprises two blocks, respectively as a switch part and a temperature sensing part. Each block is formed from one or more cells. The switch part has a first electrode coupled to the control terminal, a second electrode coupled to the ground terminal, and a third electrode coupled to the phase terminal. The temperature sensing part has a first electrode, a second electrode coupled to the temperature signal output terminal, and a third electrode coupled to the third electrode of the switch part. The switch part and the temperature sensing part are configured as a MOS transistor made by a same manufacturing process.

In an embodiment of the invention, the first electrode and the second electrode of the temperature sensing part are coupled to the temperature signal output terminal.

In an embodiment of the invention, the first electrode of the temperature sensing part is coupled to the second electrode of the switch part.

In an embodiment of the invention, when a voltage of the temperature signal output terminal is greater than a voltage of the phase terminal, the temperature sensing function is activated.

In an embodiment of the invention, the power MOS transistor die is configured as a low side switch of a power converting circuit.

In an embodiment of the invention, the integrated circuit further comprises a controller die. The controller die comprises a level shifter, a first comparator and a switch. The level shifter is coupled to the phase terminal to convert a signal from the phase terminal. The first comparator has a first input terminal coupled to an output terminal of the level shifter. The first comparator has a second input terminal coupled to the temperature signal output terminal. The switch has a terminal coupled to an output terminal of the first comparator, and the switch has another terminal used to output a temperature protection signal. The conduction times for the switch of the controller die and the control terminal of the power MOS transistor die are simultaneous.

In an embodiment of the invention, the level shifter comprises a first constant current source, a second constant current source and a first resistor. The first constant current source is coupled to the first input terminal of the first comparator. The second constant current source is coupled to the temperature signal output terminal and the second input terminal of the first comparator. The first resistor has a terminal coupled to the first input terminal of the first comparator, and the first resistor has another terminal coupled to the phase terminal.

In an embodiment of the invention, the controller die further comprises a level shifter and a switch. The level shifter used to convert signals from the phase terminal and the temperature signal output terminal has a first terminal coupled to the phase terminal, a second terminal coupled to the temperature signal output terminal, an output terminal, and a ground terminal. The switch has a terminal coupled to the output terminal of the level shifter, and the switch has another terminal used to output a temperature monitoring signal. The conduction times for the switch of the controller die and the control terminal of the power MOS transistor die are simultaneous.

In an embodiment of the invention, the level shifter further comprises a third constant current source, a second comparator, a second resistor, an n-type MOS transistor, a current mirror, and a third resistor. A terminal of the third constant current source is coupled to the temperature signal output terminal. A first input terminal of the second comparator is coupled to the temperature signal output terminal. A terminal of the second resistor is coupled to a second input terminal of the second comparator and another terminal of the second resistor is coupled to the phase terminal. A gate of the n-type MOS transistor is coupled to an output terminal of the second comparator and a source of the n-type MOS transistor is coupled to a second input terminal of the second comparator. The current mirror is coupled to a drain of the n-type MOS transistor and a terminal of the switch. The third resistor is coupled between a terminal of the switch and the ground terminal.

As to foregoing descriptions, the integrated circuit with the temperature sensing function in the invention can be made without changing the manufacturing process as originally set, in which the switch part and the temperature sensing part are configured within the same one of power MOS transistor die. The temperature sensing part in the invention can sense the temperature change of the power MOS transistor die and the precision on temperature protection can be improved. In addition, it can be avoided that the integrated circuit is burnt down due to over temperature. On other hand, in comparison with the conventional integrated circuit with temperature sensing function, the invention has simple structure. Further, an increase of circuit area can be avoided because the original manufacture process is not changed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
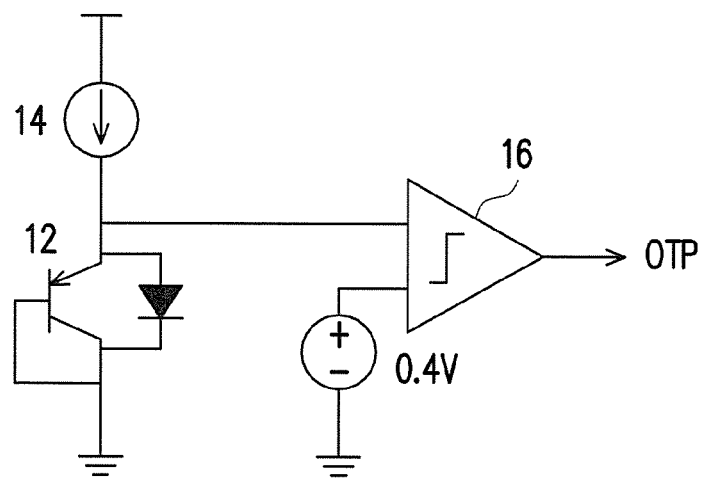
FIG. 1 is a drawing, schematically illustrating a circuit of a conventional temperature sensor.

Reference will now be made in detail to the present preferred embodiments of the invention, examples are illustrated in the accompanying drawings. Wherever possible, the same reference numbers are used in the drawings and the description to refer to the same or like parts.

In the following embodiments, when a device is connect or coupled to another device, it can be a direct connection or coupling to another device, in which other device may exit there between the two devices. The term of "circuit' can represent at least one device or more devices, or the devices being actively or passively coupled together to have the suitable function. The term of "signal" can represent at lease one of current, voltage, data or other signal. As understandable, the signal used in the whole description and the drawings can be voltage or current in physical property. The term of "simultaneous" represents the switch action on the period of the signal are related to, not necessary to be specifically limited to the same time.

As understandable, although the terms of "first", "second", . . . , and so on, can used to describe the device, the devices are not necessary to be limited to these kinds of terms. These terms are just used to be distinct between one device and another device. For example, not beyond the situations as described in the disclosure, a first switch can be also called a second switch, and likewise, a second switch can also be called a first switch.

Figure 4A:
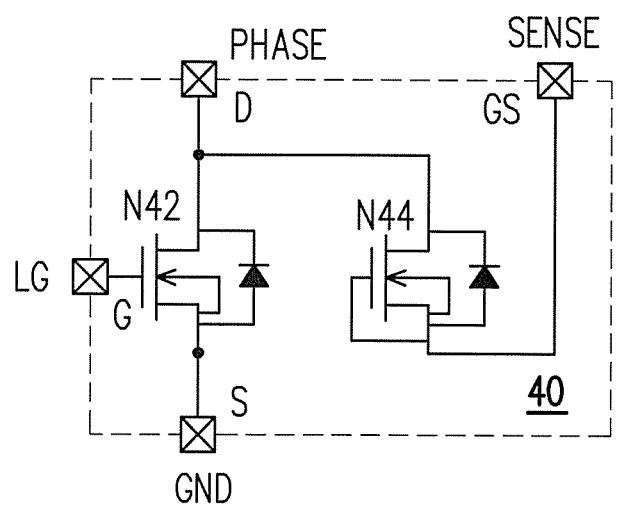
FIG. 4A is a drawing, schematically illustrating an equivalent circuit for a power MOS transistor die, according to an embodiment of the invention.
Figure 4B:
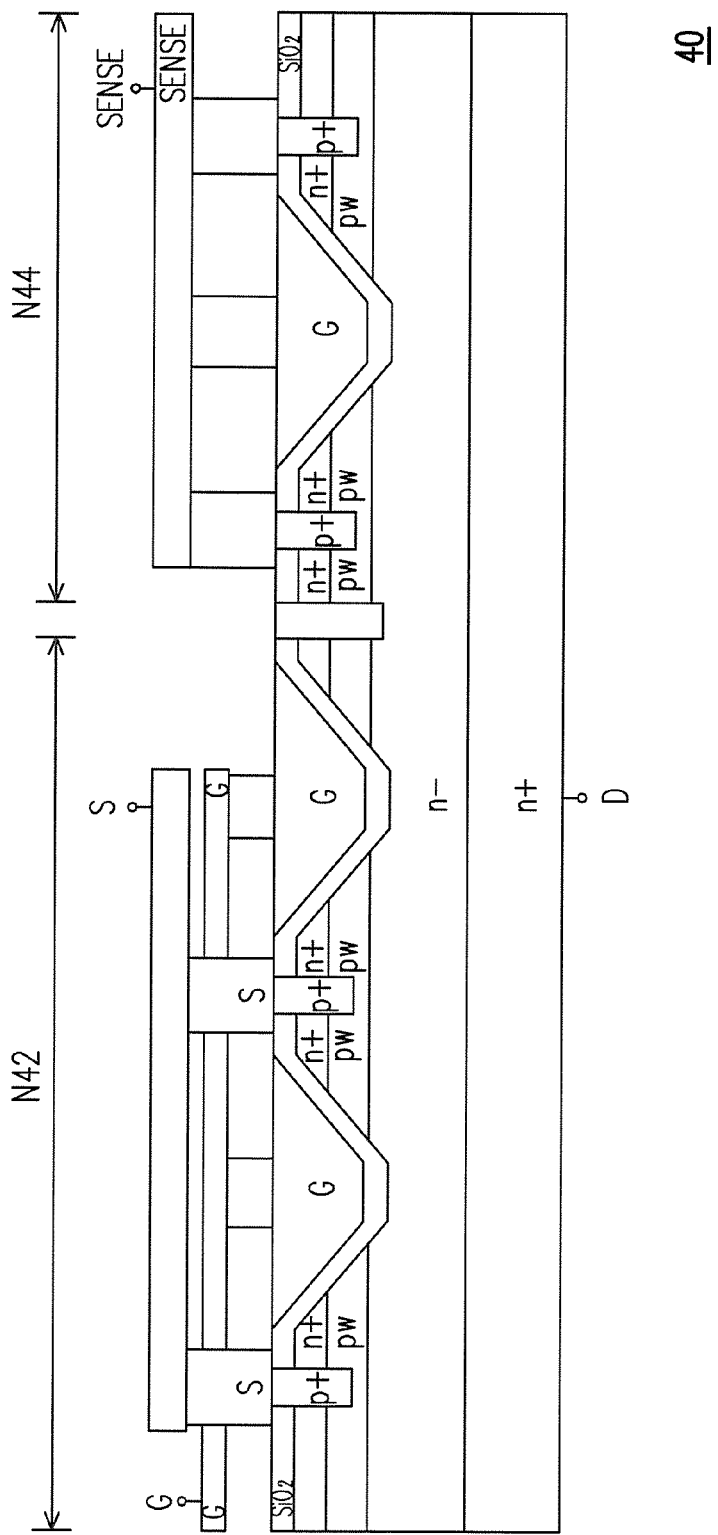
FIG. 4B is a drawing, schematically illustrating the cross-sectional view of structure of the power MOS transistor die in FIG. 4A, according to an embodiment of the invention.

FIG. 4A is a drawing, schematically illustrating an equivalent circuit for a power MOS transistor die, according to an embodiment of the invention. FIG. 4B is a drawing, schematically illustrating the cross-sectional view of structure of the power MOS transistor die in FIG. 4A, according to an embodiment of the invention. Please refer to FIG. 4A and FIG. 4B. In FIG. 4B, except that metal wire on top layer relating to electrode may have slight difference, the power MOS transistor die 40 as indicated has similar structure with three NMOS cells. The indications of "PHASE", "LG", and "GND" respectively represent a phase terminal, a control terminal, and a ground terminal. The indications of "G", "D", "S", and "GS" respectively represent a gate, a drain, a source, and the gate and the source connected together. The indications of "n+", "n-", "p+", "pw", and "SiO$_2$" respectively represent a highly doped n-type region, a lowly doped n-type region, a highly doped p-type region, p well region, and silicon oxide region. The detail structure of power MOS transistor die is known to the one with ordinary skill in the art, and the detail structure is omitted in the following descriptions.

The power MOS transistor die 40 comprises a control terminal LG, a phase terminal PHASE, a ground terminal GND, and a temperature signal output terminal SENSE, and further comprises a switch part N42 and a temperature sensing part N44. In FIG. 4B, the cell number of the switch part N42 is two, but it can be one or more than two, depending on the actual design. The cell number of the temperature sensing part N44 as shown in FIG. 4B is one, but it can be multiple, depending on the actual design.

The switch part N42 has a first electrode (gate G), a second electrode (source S) and a third electrode (drain D). The first electrode of the switch part N42 is coupled to the control terminal LG and the second electrode is coupled to the ground terminal GND and the third electrode is coupled to the phase terminal PHASE. Likewise, the temperature sensing part N44 also has a first electrode (gate G), a second electrode (source S) and a third electrode (drain D). The second electrode of the temperature sensing part N44 is coupled to the temperature signal output terminal SENSE, and the third electrode thereof is coupled to the third electrode of the switch part N42.

In FIG. 4A, both of the first electrode and the second electrode of the temperature sensing part N44 are coupled to the temperature signal output terminal SENSE. The switch part N42 and the temperature sensing part N44 share the drain D, in which the drain D is coupled with the phase terminal PHASE.

In addition, when a voltage of the temperature signal output terminal SENSE is greater than a voltage of the phase terminal PHASE, the temperature sensing function can be activated.

Figure 3A:
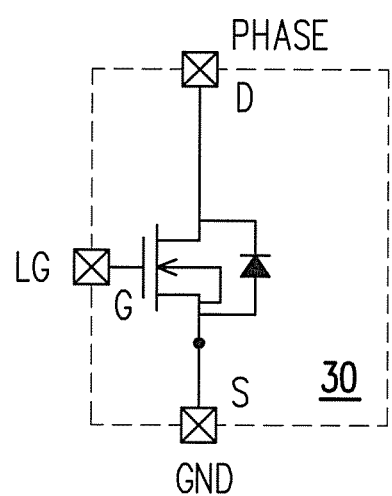
FIG. 3A is a drawing, schematically illustrating an equivalent circuit for the conventional power MOS transistor die.
Figure 3B:
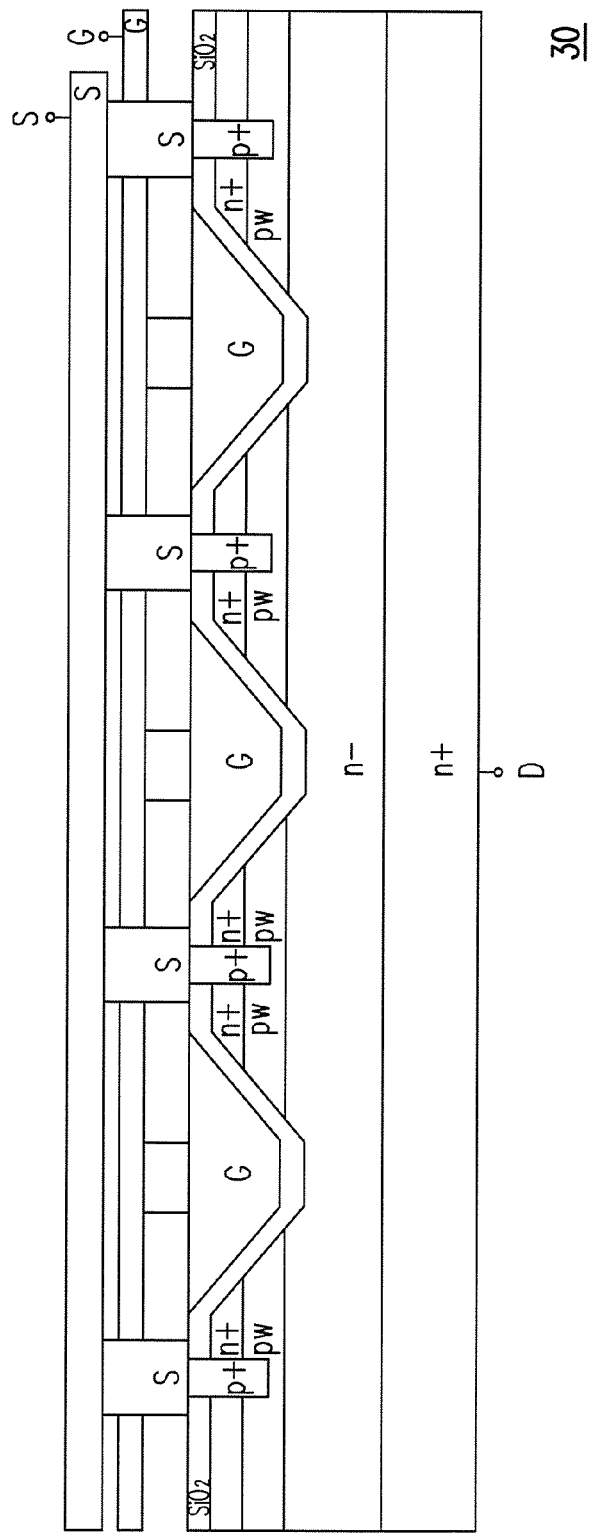
FIG. 3B is a drawing, schematically illustrating the cross-sectional view of structure of the power MOS transistor die in FIG. 3A.

In an embodiment, the manufacturing process originally set for the power MOS transistor die 40 can remain without change. The switch part N42 and the temperature sensing part N44 are configured as the MOS transistors made by the same manufacture process. Thereby, the switch part N42 and the temperature sensing part N44 can be configured in the same one of the power MOS transistor die 40. In comparison with the power MOS transistor die 30 in FIG. 3A, the power MOS transistor die 40 is additionally configured with the temperature signal output terminal SENSE.

Figure 5A:
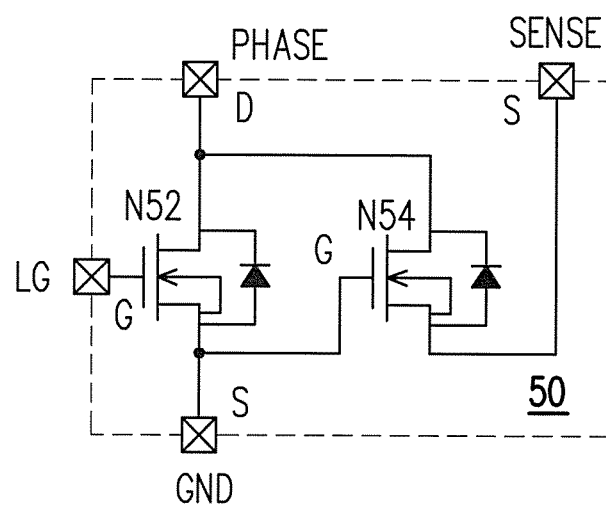
FIG. 5A is a drawing, schematically illustrating an equivalent circuit for a power MOS transistor die, according to an embodiment of the invention.
Figure 5B:
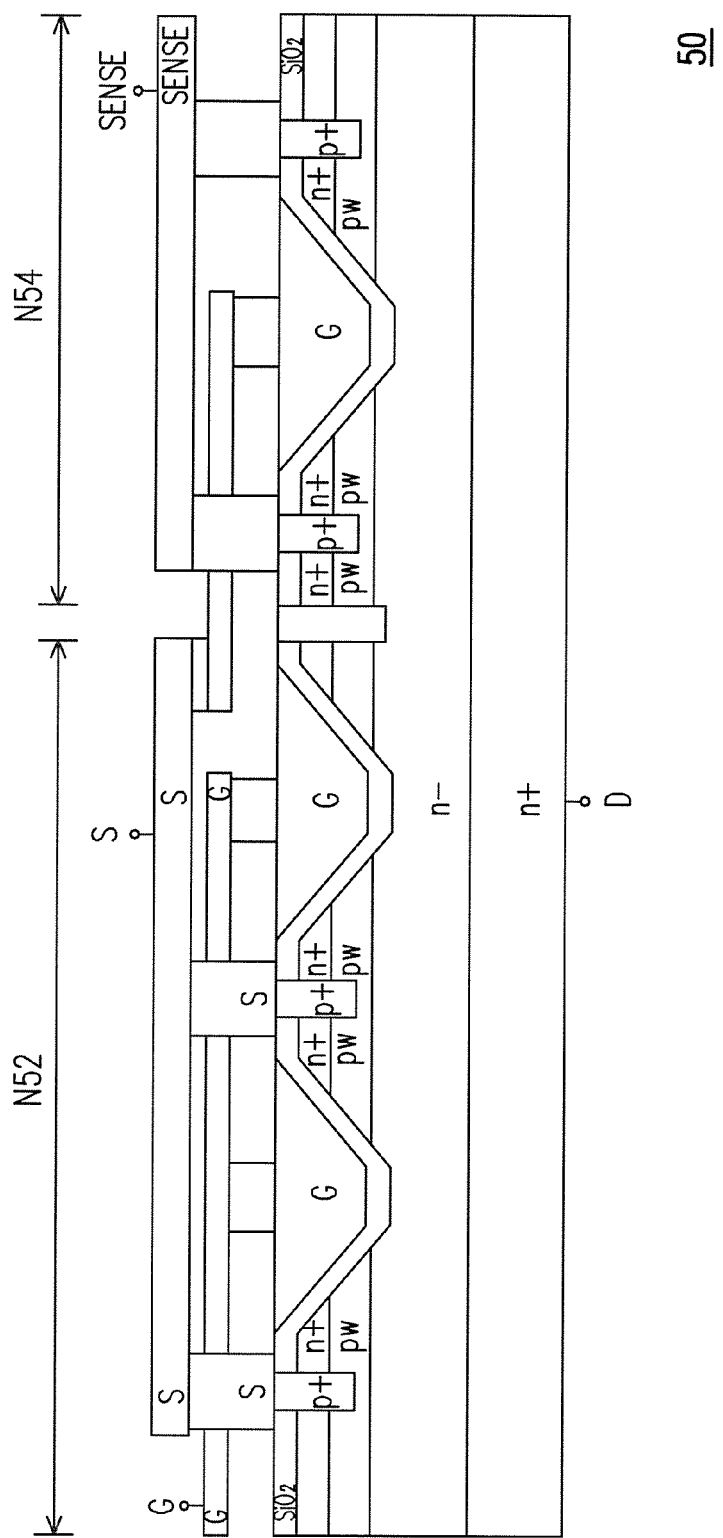
FIG. 5B is a drawing, schematically illustrating the cross-sectional view of structure of the power MOS transistor die in FIG. 5A, according to an embodiment of the invention

FIG. 5A is a drawing, schematically illustrating an equivalent circuit for a power MOS transistor die, according to an embodiment of the invention. FIG. 5B is a drawing, schematically illustrating the cross-sectional view of structure of the power MOS transistor die in FIG. 5A, according to an embodiment of the invention. Please Refer to FIG. 5A and FIG. 5B. A power MOS transistor die 50 comprises a switch part N52 and a temperature sensing part N54. In other words, the switch part N52 and the temperature sensing part N54 are configured into the same one of the power MOS transistor die 50. As shown FIG. 5B, the cell number of the switch part N52 is two, but it can be one or more than two, depending on the actual design. The cell number of the temperature sensing part N54 as shown in FIG. 5B is one, but it can be multiple, depending on the actual design.

The coupling manner for the switch part N52 in FIG. 5A is the same as the coupling manner for the switch part N42 in FIG. 4A. The coupling manner for the temperature sensing part N54 in FIG. 5A is similar to the coupling manner for the temperature sensing part N44 in FIG. 4A. The difference is just that the first electrode (gate G) of the temperature sensing part N54 is not coupled to the second electrode (source S) of the temperature sensing part N54 but coupled to the second electrode (source S) of the switch part N52.

Figure 2:
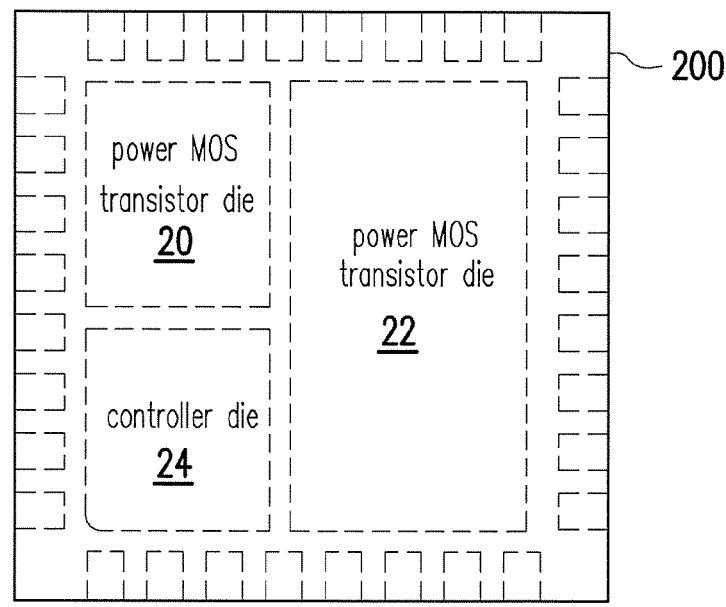
FIG. 2 is drawing, schematically illustrating a top view of conventional IC deployment.
Figure 6:
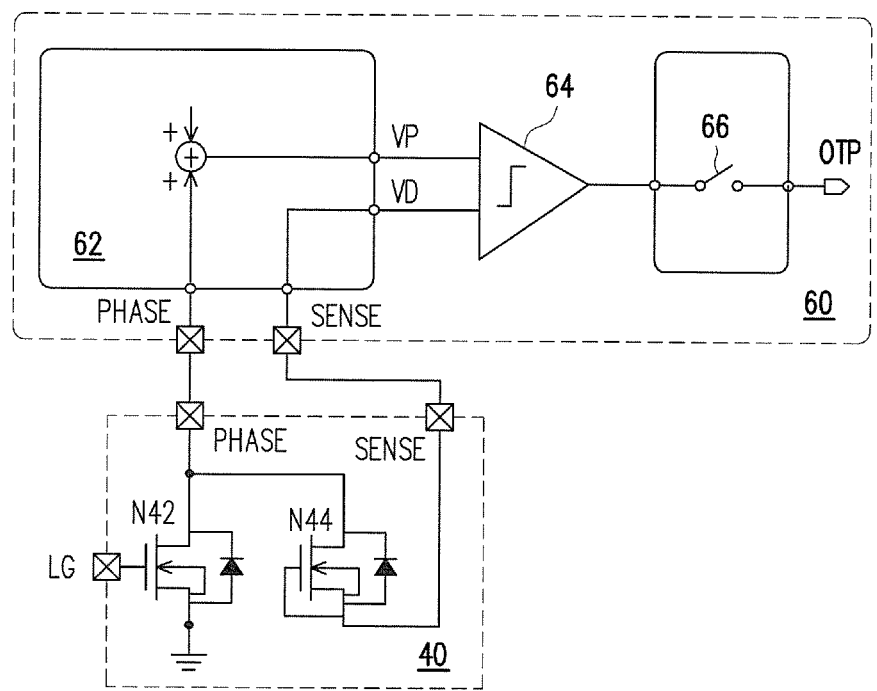
FIG. 6 is a drawing, schematically illustrating a circuit diagram of an integrated circuit with a temperature sensing function, according to an embodiment of the invention.

FIG. 6 is a drawing, schematically illustrating a circuit diagram of an integrated circuit with a temperature sensing function, according to an embodiment of the invention. Please refer to FIG. 6. An integrated circuit 600 comprises the power MOS transistor die 40 and a controller die 60. The power MOS transistor die 40 comprises a switch part N42 and a temperature sensing part N44. The embodiment for the power MOS transistor die 40 can refer to the descriptions for FIG. 4A and FIG. 4B. In addition, the power MOS transistor die 40 shown in FIG. 6 can be replaced with the power MOS transistor die 50. The embodiment for the power MOS transistor die 50 can refer to the descriptions for FIG. 5A and FIG. 5B. In addition, the configuring location of the power MOS transistor die 40 can be corresponding to the power MOS transistor die 20 or 22 in FIG. 2, and the configuring location of the controller die 60 can be corresponding to the controller die 24 in FIG. 2.

The controller die 60 comprises a level shifter 62, a first comparator 64 and a switch 66. The level shifter 62 is coupled to the phase terminal PHASE to convert a signal from the phase terminal PHASE. The first comparator 64 has a first input terminal coupled to an output terminal of the level shifter 62. The first comparator 64 has a second input terminal coupled to the temperature signal output terminal SENSE. The switch 66 has a terminal coupled to an output terminal of the first comparator 64, and the switch 66 has another terminal used to output a temperature protection signal OTP. The conduction times (ON time) for the switch 66 of the controller die 60 and the control terminal LG of the power MOS transistor die 40 are simultaneous.

When the power MOS transistor die 40 is turned on, the integrated circuit 600 uses the switch 66 to perform temperature sensing. At this moment, the phase terminal PHASE is reduced to a low voltage level, such as ground voltage. The parasitic diode of the temperature sensing part N44 would generate different voltage in accordance with different temperature. When a voltage of the temperature signal output terminal SENSE is greater than a voltage of the phase terminal PHASE, the temperature sensing function can be activated. The power MOS transistor die 40 can transmit the signals at the temperature signal output terminal SENSE and the phase terminal PHASE to the controller die 60. The level shifter 62 is used to perform converting operation on the signal from the phase terminal PHASE and generates the voltage VP. As a result, the first comparator 64 can compare the voltage VP with a voltage VD at the temperature signal output terminal SENSE, and further a temperature protection signal OTP is output by the switch 66.

In an embodiment of the invention, when the integrated circuit 600 belongs to a buck structure of a power converting circuit, the effect of the switch part N42 configured in the power MOS transistor die 40 is equivalent to the low side switch of the power converting circuit.

Figure 7:
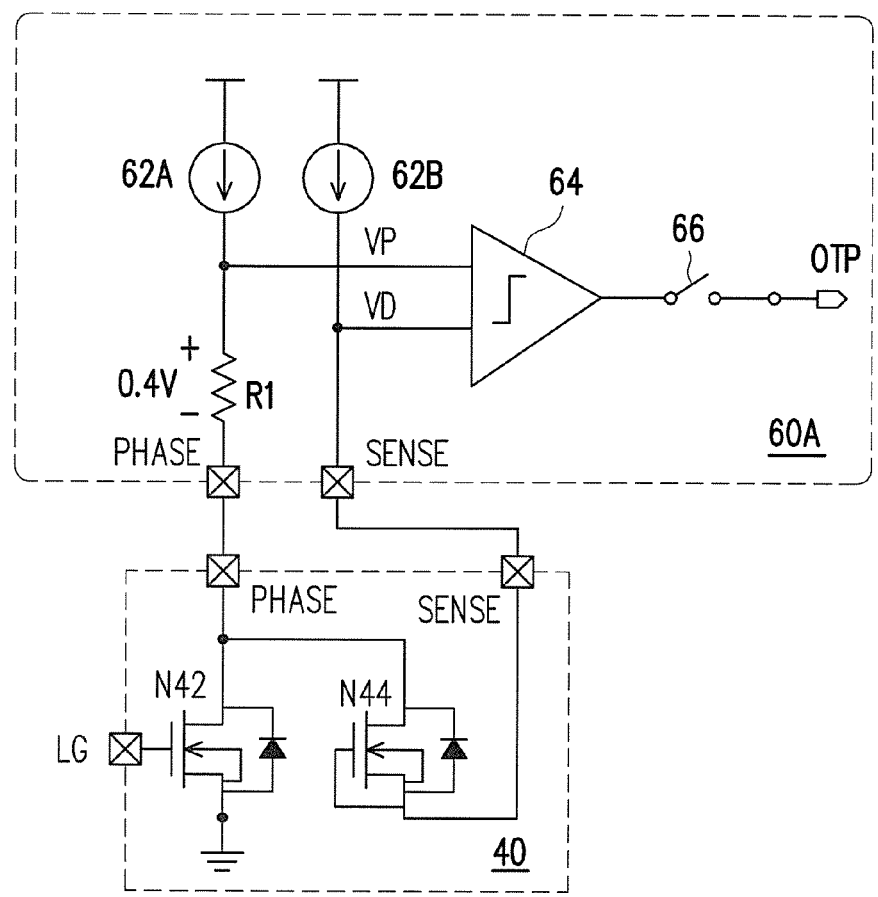
FIG. 7 is a drawing, schematically illustrating a circuit diagram of an integrated circuit with a temperature sensing function, according to an embodiment of the invention.

FIG. 7 is a drawing, schematically illustrating a circuit diagram of an integrated circuit with a temperature sensing function, according to an embodiment of the invention. Referring to FIG. 7, the integrated circuit 600A is based on the structure of the integrated circuit 600. About the descriptions of the first comparator 64 and the switch 66 can be referred to the foregoing descriptions and the descriptions are not repeated here.

In the controller die 60A, the level shifter 62 comprises a first constant current source 62A, a second constant current source 62B, and a first resistor R1. The first constant current source 62A is coupled to a first input terminal of the first comparator 64 and is coupled to the phase terminal PHASE through the first resistor R1. The second constant current source 62B is coupled to the temperature signal output terminal SENSE and a second input terminal of the first comparator 64. The first resistor R1 has a terminal coupled to the first input terminals of the first constant current source 62A and the first comparator 64. The first resistor R1 has another terminal coupled to the phase terminal PHASE. Due to effect form the first constant current source 62A and the first resistor R1, the voltage at the phase terminal PHASE is added with a value to generate voltage VP, used for comparison. As a result, the first comparator 64 can compare the voltage VP with the voltage VD at the temperature signal output terminal SENSE, and then a temperature protection signal OTP is output through the switch 66.

Figure 8:
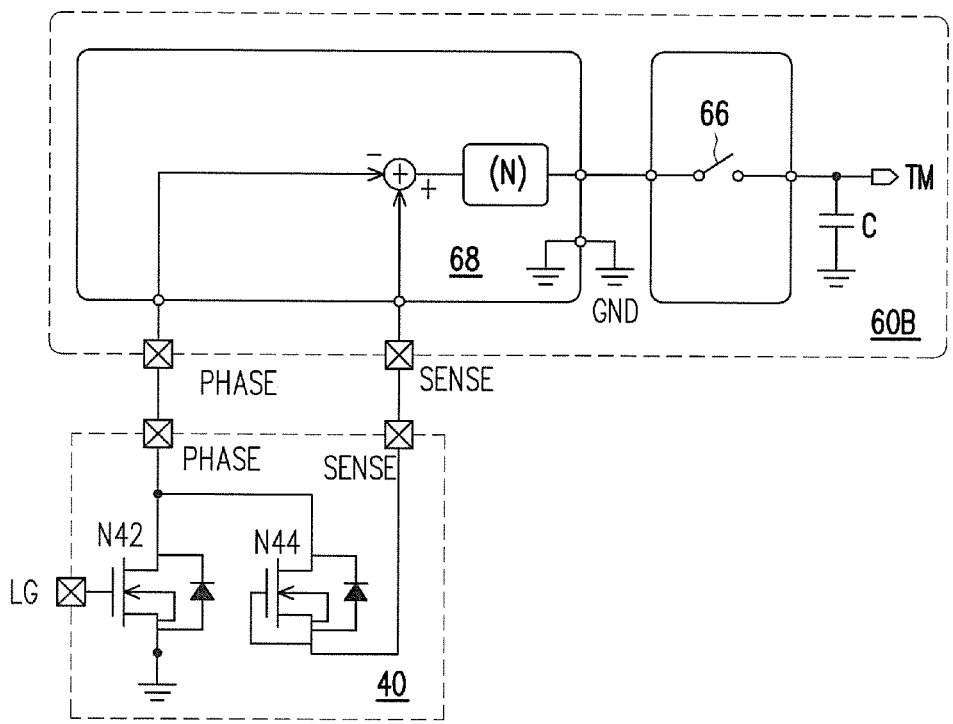
FIG. 8 is a drawing, schematically illustrating a circuit diagram of an integrated circuit with a temperature sensing function, according to an embodiment of the invention.

FIG. 8 is a drawing, schematically illustrating a circuit diagram of an integrated circuit with a temperature sensing function, according to an embodiment of the invention. Referring to FIG. 8, the integrated circuit 800 comprises the power MOS transistor die 40 and the controller die 60B. The power MOS transistor die 40 comprises the switch part N42 and the temperature sensing part N44. About the implementation for the power MOS transistor die 40 can be referred to the descriptions in FIG. 4A and FIG. 4B. In addition, the power MOS transistor die 40 in FIG. 8 can be replaced with the power MOS transistor die 50. About the implementation for the power MOS transistor die 50 can be referred to the descriptions in FIG. 5A and FIG. 5B. In addition, the configuring location of the power MOS transistor die 40 can be corresponding to the power MOS transistor die 20 or 22 in FIG. 2, and the configuring location of the controller die 60B can be corresponding to the controller die 24 in FIG. 2.

The controller die 60B comprises the switch 66. The conduction time of the switch 66 of the controller die 60B is simultaneous with the conduction time of control terminal LG of the power MOS transistor die 40. When the power MOS transistor die 40 is turned on, the integrated circuit 800 uses the switch 66 to perform temperature sensing. At this moment, the phase terminal PHASE is reduced to a low voltage level, such as ground voltage. The parasitic diode of the temperature sensing part N44 would generate different voltage in accordance with different temperature. When a voltage of the temperature signal output terminal SENSE is greater than a voltage of the phase terminal PHASE, the temperature sensing function can be activated. The power MOS transistor die 40 can transmit the signals at the temperature signal output terminal SENSE and the phase terminal PHASE to the controller die 60B.

In detail, the controller die 60B can further comprise a level shifter 68. A first terminal of the level shifter 68 is coupled to the phase terminal PHASE, and a second terminal thereof is coupled to the temperature signal output terminal SENSE, and an output terminal thereof is coupled to a terminal of the switch 66, and a ground terminal GND thereof is grounded. The level shifter 68 is used to perform the converting operation on the two signals from the phase terminal PHASE and the temperature signal output terminal SENSE. The switch 66 has another terminal used to output a temperature monitoring signal TM.

In am embodiment of the invention, when the integrated circuit 800 belongs to a buck structure of a power converting circuit, the effect of the switch part N42 configured in the power MOS transistor die 40 is equivalent to the low side switch of the power converting circuit.

Figure 9:
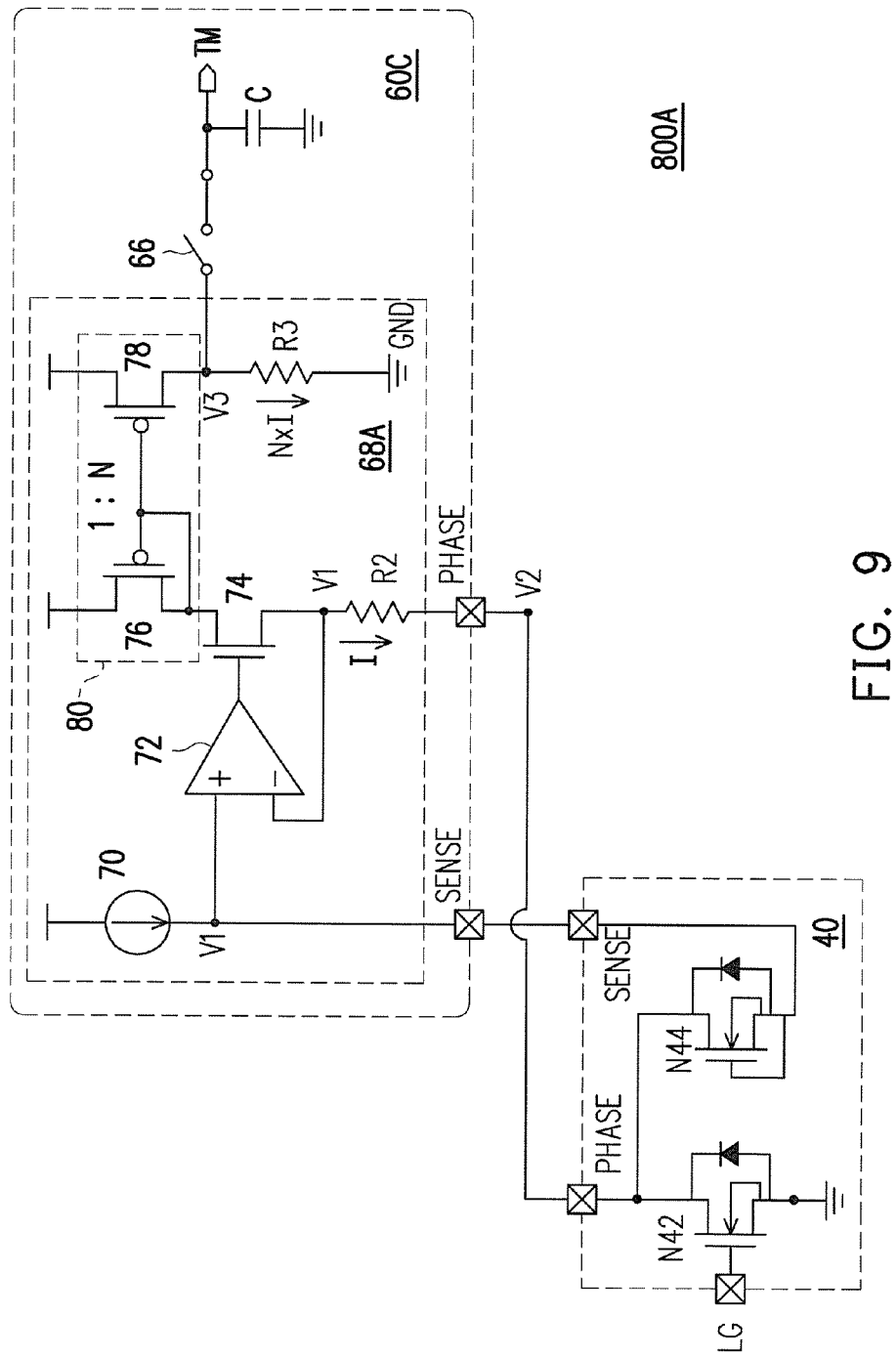
FIG. 9 is a drawing, schematically illustrating a circuit diagram of an integrated circuit with a temperature sensing function, according to an embodiment of the invention.

FIG. 9 is a drawing, schematically illustrating a circuit diagram of an integrated circuit with temperature sensing function, according to an embodiment of the invention. Referring to FIG. 9, an integrated circuit 800A is based on the structure of the integrated circuit 800. In the controller die 60C, the level shifter 68A comprises a third constant current source 70, a second comparator 72, a second resistor R2, an n-type MOS transistor 74, a current mirror 80 including a first p-type MOS transistor 76 and a second p-type MOS transistor 78, and a third resistor R3. The third constant current source 70 has a terminal coupled to the temperature signal output terminal SENSE. The second comparator R2 has a first input terminal, such as positive input terminal, also coupled to the temperature signal output terminal SENSE. The second resistor R2 has a terminal coupled to a second input terminal, such as the negative input terminal, of the second comparator 72 and another terminal coupled to the phase terminal PHASE. The n-type MOS transistor 74 has a gate coupled to an output terminal of the second comparator 72 and a source coupled to the second input terminal of the second comparator 72. The first p-type MOS transistor 76 has a gate and a drain, both coupled to the drain of the n-type MOS transistor 74. The second p-type MOS transistor 78 has a gate coupled to the gate of the first p-type MOS transistor 76, and a drain coupled to a terminal of the switch 66. The third resistor R3 has a terminal coupled to the drain of the second p-type MOS transistor 78, and another terminal coupled to the ground terminal GND. The first p-type MOS transistor 76 and the second p-type MOS transistor 78 are configured as the current mirror 80. Another terminal of the switch 66 is used to output a temperature monitoring signal TM.

The level shifter 68A converts the signal between the temperature signal output terminal SENSE and the phase terminal PHASE into the temperature monitoring signal TM with respect to the ground (GND). The mechanism is as follows. The level shifter 68A converts the voltage V1 at the temperature signal output terminal SENSE and the voltage V2 at the phase terminal PHASE into current signal I, and then amplifies the current signal I by N times through the current mirror 80. As a result, the amplified current signal (N×I) generates a voltage V3 at a terminal of the third resistor R3. The voltage V3 is a signal with respect to the ground (GND). The voltage V3 can be sampled and maintained by the switch 66 and the capacitor C and the sensed signal is stored in the capacitor C to serve as the temperature monitoring signal TM.

In addition, the amplification factor in the current mirror 80 is 1:N, where N is the amplification factor and can be one or more than 1. The values of the second resistor R2 and the second resistor R3 can be the same or not the same.

In an embodiment of the invention, the temperature monitoring signal TM can be further amplified for easy application in the post-stage circuit.

As to the foregoing descriptions, the integrated circuit with the temperature sensing function in the invention can be made without changing the manufacturing process as originally set, in which the switch part and the temperature sensing part are configured within the same one of power MOS transistor die. The temperature sensing part in the invention can sense the temperature change of the power MOS transistor die and the precision on temperature protection can be improved. In addition, it can be avoided that the integrated circuit is burnt down due to over temperature. On other hand, in comparison with the conventional integrated circuit with temperature sensing function, the invention has simple structure. Further, an increase of circuit area can be avoided because the original manufacture process is not changed.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A power metal-oxide-semiconductor (MOS) transistor die with a temperature sensing function comprising:
   a control terminal, a phase terminal, a ground terminal, and a temperature signal output terminal;
   a switch part having:
      a first electrode, coupled to the control terminal;
      a second electrode, coupled to the ground terminal; and
      a third electrode coupled to the phase terminal; and
   a temperature sensing part having:
      a first electrode;
      a second electrode, coupled to the temperature signal output terminal; and
      a third electrode, coupled to the third electrode of the switch part,
   wherein the switch part and the temperature sensing part are MOS transistors made by a same manufacturing process.

2. The power MOS transistor die according to claim 1, wherein the first electrode and the second electrode of the temperature sensing part are coupled to the temperature signal output terminal.

3. The power MOS transistor die according to claim 1, wherein the first electrode of the temperature sensing part is coupled to the second electrode of the switch part.

4. The power MOS transistor die according to claim 1, wherein when a voltage of the temperature signal output terminal is greater than a voltage of the phase terminal, the temperature sensing function is activated.

5. The power MOS transistor die according to claim 1, wherein the power MOS transistor die is configured as a low side switch of a power converting circuit.

6. An integrated circuit with a temperature sensing function, comprising:
   a power metal-oxide-semiconductor (MOS) transistor die, comprising:
      a control terminal, a phase terminal, a ground terminal, and a temperature signal output terminal;
      a switch part, having a first electrode coupled to the control terminal, a second electrode coupled to the ground terminal and a third electrode coupled to the phase terminal; and
      a temperature sensing part, having a first electrode, a second electrode coupled to the temperature signal output terminal and a third electrode coupled to the third electrode of the switch part;
      wherein the switch part and the temperature sensing part are MOS transistors made by a same manufacturing process; and
   a controller die, comprising:
      a level shifter, coupled to the phase terminal to convert a signal from the phase terminal;
      a first comparator, having a first input terminal coupled to an output terminal of the level shifter and a second input terminal coupled to the temperature signal output terminal; and
      a switch, having a terminal coupled to an output terminal of the first comparator and another terminal used to output a temperature protection signal,
   wherein conduction times for the switch of the controller die and the control terminal of the power MOS transistor die are simultaneous.

7. The integrated circuit according to claim 6, wherein the level shifter comprises:
   a first constant current source, coupled to the first input terminal of the first comparator;
   a second constant current source, coupled to the temperature signal output terminal and the second input terminal of the first comparator; and
   a first resistor, having a terminal coupled to the first input terminal of the first comparator and another terminal coupled to the phase terminal.

8. An integrated circuit with a temperature sensing function, comprising:
   a power metal-oxide-semiconductor (MOS) transistor die, comprising:
      a control terminal, a phase terminal, a ground terminal, and a temperature signal output terminal;
      a switch part, having a first electrode coupled to the control terminal, a second electrode coupled to the ground terminal and a third electrode coupled to the phase terminal; and
      a temperature sensing part, having a first electrode, a second electrode coupled to the temperature signal output terminal and a third electrode coupled to the third electrode of the switch part;
   wherein the switch part and the temperature sensing part are MOS transistors made by a same manufacturing process; and
   a controller die, comprising:
      a level shifter used to convert signals from the phase terminal and the temperature signal output terminal, having:
         a first terminal coupled to the phase terminal;
         a second terminal coupled to the temperature signal output terminal;
         an output terminal; and
         a ground terminal; and
      a switch, having a terminal coupled to an output terminal of the level shifter and another terminal used to output a temperature monitoring signal,
   wherein conduction times for the switch of the controller die and the control terminal of the power MOS transistor die are simultaneous.

9. The integrated circuit according to claim 8, wherein the level shifter further comprises:
   a third constant current source, having a terminal coupled to the temperature signal output terminal;
   a second comparator, having a first input terminal coupled to the temperature signal output terminal;
   a second resistor, having a terminal coupled to a second input terminal of the second comparator and another terminal is coupled to the phase terminal;
   an n-type MOS transistor, having a gate coupled to an output terminal of the second comparator and a source is coupled to the second input terminal of the second comparator;
   a current mirror, coupled to a drain of the n-type MOS transistor and the terminal of the switch; and
   a third resistor, coupled between the terminal of the switch and the ground terminal.

* * * * *